US008911588B2

(12) United States Patent
Nam et al.

(10) Patent No.: US 8,911,588 B2
(45) Date of Patent: *Dec. 16, 2014

(54) METHODS AND APPARATUS FOR SELECTIVELY MODIFYING RF CURRENT PATHS IN A PLASMA PROCESSING SYSTEM

(75) Inventors: Sang Ki Nam, Contra Costa, CA (US); Rajinder Dhindsa, San Jose, CA (US); Alexei Marakhtanov, Albany, CA (US)

(73) Assignee: Lam Research Corporation, Fremont, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/423,281

(22) Filed: Mar. 19, 2012

(65) Prior Publication Data

US 2013/0240482 A1    Sep. 19, 2013

(51) Int. Cl.
| H01J 37/04 | (2006.01) |
| H01J 37/24 | (2006.01) |
| H01J 37/248 | (2006.01) |
| C23C 16/505 | (2006.01) |
| C23C 16/52 | (2006.01) |
| H01J 37/32 | (2006.01) |
| C23C 16/458 | (2006.01) |

(52) U.S. Cl.
CPC ....... *H01J 37/32082* (2013.01); *H01J 37/3299* (2013.01); *C23C 16/52* (2013.01); *C23C 16/4585* (2013.01); *H01J 37/32935* (2013.01); *H01J 37/32174* (2013.01); *C23C 16/505* (2013.01)
USPC ............ 156/345.28; 156/345.24; 156/345.43; 156/345.44; 118/715; 118/723 R; 118/723 E; 216/67; 216/71

(58) Field of Classification Search
None
See application file for complete search history.

(56) References Cited

U.S. PATENT DOCUMENTS

| 6,857,387 | B1 * | 2/2005 | Sun et al. ................... 118/723 R |
| 7,083,702 | B2 * | 8/2006 | Blonigan et al. .......... 156/345.47 |
| 7,611,640 | B1 * | 11/2009 | Howald et al. ............ 156/345.43 |
| 7,967,930 | B2 * | 6/2011 | Lewington et al. ....... 118/723 R |
| 7,988,815 | B2 * | 8/2011 | Rauf et al. ................ 156/345.43 |
| 8,264,153 | B2 * | 9/2012 | Kim ......................... 315/111.21 |
| 2004/0250955 | A1 * | 12/2004 | Blonigan et al. ......... 156/345.43 |
| 2005/0034811 | A1 * | 2/2005 | Mahoney et al. ........ 156/345.24 |
| 2005/0233595 | A1 * | 10/2005 | Choi et al. ..................... 438/778 |
| 2005/0251990 | A1 * | 11/2005 | Choi et al. .................... 118/715 |
| 2005/0255257 | A1 * | 11/2005 | Choi et al. .................... 118/715 |
| 2005/0276928 | A1 * | 12/2005 | Okumura et al. ............. 427/446 |
| 2005/0279457 | A1 * | 12/2005 | Matsudo et al. ......... 156/345.47 |
| 2006/0060302 | A1 * | 3/2006 | White et al. .............. 156/345.28 |
| 2006/0228496 | A1 * | 10/2006 | Choi et al. .................... 118/715 |
| 2007/0012659 | A1 * | 1/2007 | Rusu et al. ............... 156/345.33 |
| 2007/0227666 | A1 * | 10/2007 | Matsumoto et al. ..... 156/345.47 |

(Continued)

*Primary Examiner* — Jeffrie R Lund
*Assistant Examiner* — Stanislav Antolin
(74) *Attorney, Agent, or Firm* — Martine Penilla Group, LLP

(57) ABSTRACT

Methods and apparatus for modifying RF current path lengths are disclosed. Apparatus includes a plasma processing system having an RF power supply and a lower electrode having a conductive portion. There is included an insulative component disposed in an RF current path between the RF power supply and the conductive portion. There are included a plurality of RF path modifiers disposed within the insulative component, the plurality of RF path modifiers being disposed at different angular positions relative to a reference angle drawn from a center of the insulative component, whereby at least a first one of the plurality of RF path modifiers is electrically connected to the conductive portion and at least a second one of the plurality of the plurality of RF path modifiers is not electrically connected to the conductive portion.

20 Claims, 14 Drawing Sheets

(56) References Cited

U.S. PATENT DOCUMENTS

| | | | |
|---|---|---|---|
| 2007/0235426 A1* | 10/2007 | Matsumoto et al. | 219/121.43 |
| 2007/0283889 A1* | 12/2007 | Lee | 118/723 E |
| 2008/0116876 A1* | 5/2008 | White et al. | 324/76.11 |
| 2008/0274297 A1* | 11/2008 | Furuta et al. | 118/715 |
| 2009/0025878 A1* | 1/2009 | Rauf et al. | 156/345.48 |
| 2009/0025879 A1* | 1/2009 | Rauf et al. | 156/345.48 |
| 2009/0071938 A1* | 3/2009 | Dhindsa et al. | 156/345.48 |
| 2009/0159423 A1* | 6/2009 | Kudela et al. | 156/345.38 |
| 2009/0242135 A1* | 10/2009 | Koshimizu et al. | 156/345.48 |
| 2010/0078129 A1* | 4/2010 | Himori et al. | 156/345.43 |
| 2010/0089319 A1* | 4/2010 | Sorensen et al. | 118/723 E |
| 2010/0136261 A1* | 6/2010 | Tso et al. | 118/723.1 |
| 2010/0176086 A1* | 7/2010 | Iwata | 216/71 |
| 2010/0196626 A1* | 8/2010 | Choi et al. | 427/569 |
| 2010/0243608 A1* | 9/2010 | Koshimizu | 156/345.1 |
| 2011/0135844 A1* | 6/2011 | Sorensen et al. | 118/723 E |
| 2012/0032596 A1* | 2/2012 | Kim | 315/111.21 |
| 2013/0127124 A1* | 5/2013 | Nam et al. | 279/128 |
| 2013/0128409 A1* | 5/2013 | Nam et al. | 361/234 |
| 2013/0240145 A1* | 9/2013 | Nam et al. | 156/345.28 |
| 2013/0240147 A1* | 9/2013 | Nam et al. | 156/345.46 |

* cited by examiner

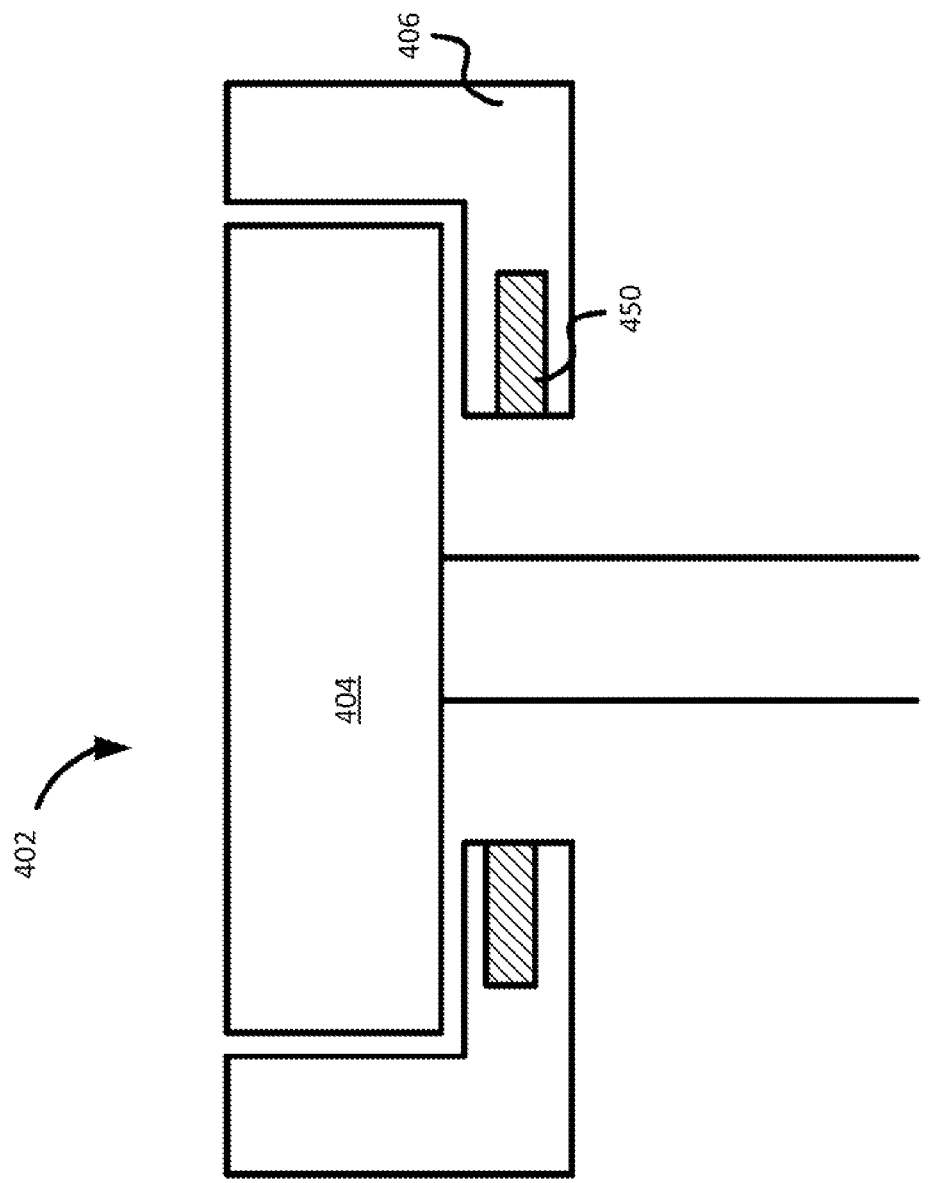

METHODS AND APPARATUS FOR SELECTIVELY MODIFYING RF CURRENT PATHS IN A PLASMA PROCESSING SYSTEM

BACKGROUND OF THE INVENTION

Plasma has long been employed to process substrates to form electronic devices. For example, plasma enhanced etching has long been employed to process semiconductor wafers into dies in the manufacture of integrated circuits or to process flat panels into flat panel displays for devices such as portable mobile devices, flat screen TVs, computer displays, and the like.

To facilitate discussion, FIG. 1 shows a typical capacitively coupled plasma processing system having an upper electrode 102, a lower electrode 104 on which a wafer 106 may be disposed for processing. Lower electrode 104 is typically disposed inside of the plasma chamber of which chamber wall 108 is shown. The region between upper electrode 102 and lower electrode 104 above wafer 106 is known as a plasma generating region denoted by reference number 110 in the example of FIG. 1. There is typically a plurality of confinement rings 112, which are substantially concentric rings disposed around and above lower electrode 104 to define and confine the plasma for processing wafer 106. These components are conventional and are not further elaborated here.

To process wafer 106, a process gas is introduced into plasma generating region 110, and RF energy is supplied to one or more of upper electrode 102 and lower electrode 104 in order to facilitate the ignition and sustenance of plasma in plasma generating region 110 for processing wafer 106. In the example of FIG. 1, a powered lower electrode and a grounded upper electrode are employed as an example set up to generate the plasma although this set up is not a requirement and both electrodes may be provided with a plurality of RF signals, for example. RF energy is provided to the lower electrode 104 from RF power supply 120 via an RF conductor 122, which is typically a conductive rod. The RF delivery path follows the direction of arrows 134A and 134B in the cutaway FIG. 1 to allow the RF energy to couple with the plasma in plasma generating region 110. RF current returns to ground following the direction of arrows 140 and 142 in the example of FIG. 1. Again, these mechanisms are known and are conventional in the field of plasma processing and are well known to those skilled in the art.

In the ideal situation, the RF delivery current (delineated, by arrows 134A and 134B) and the ground RF return current (delineated by arrows 140 and 142) are symmetric in the azimuthal direction around the chamber. In other words, given a reference orientation on the wafer surface, the ideal situation would see the RF delivery and RF return current being symmetric at any angle theta from a reference radius on the wafer surface. However, practical limitations due to chamber construction and other processing realities, may introduce non-symmetry into the chamber, which influences the azimuthal uniformity of processing results on wafer 106.

To elaborate, when the chamber components are not symmetric around the center of the chamber (as viewed from the top of the chamber) for example, the non-symmetry of chamber components influences the RF flux lines, the pressure, plasma density, RF delivery current, or RF ground return current such that the azimuthal, non-uniformity, of the process may result in non-uniform process results on the processed wafer.

FIG. 2A depicts various factors affecting the symmetry of components within the chamber and/or affecting the wafer symmetry relative to the chamber center, which may in turn affect the azimuthal uniformity of the process results on the wafer surface. With respect to FIG. 2A, there is shown a top view of chamber 200. There is shown chamber wall 202, within which there is disposed a lower electrode 204. A wafer 206 is shown disposed slightly off-center relative to, lower electrode 204. As such the processing center is offset from the center of the substrate, introducing azimuthal non-uniformity of processing results on substrate 206.

As another example; lower electrode 204 may be offset from the center of chamber 200, which may introduce non-symmetry and azimuthal non-uniformity of process results even if wafer 206 is centered correctly on lower electrode 204. Since the lower electrode 204 is charged relative to the grounded chamber wall 202, the different distances between the edge of the lower electrode 204 and chamber wall 202 around periphery of lower electrode 204 introduces variations in the parasitic coupling between the charged lower electrode and the grounded chamber wall, which in turns affect the plasma density at different locations on wafer 206, thereby introducing azimuthal non-uniformity.

Further, the RF delivery conductor (122 of FIG. 1) may be offset relative to the chamber enclosure, likewise introducing variations in the parasitic coupling between the RF conductor and the grounded chamber wall, thereby affecting the azimuthal uniformity of processing results on the wafer. Still further, the presence of certain mechanical components, such as the cantilever arm 208 that supports lower electrode 204 inside chamber 202, presents an impediment to the exhaust gas flow, which typically flows from the plasma generating region around the edge of the lower electrode to be exhausted toward the bottom of the lower electrode (150 and 152 of FIG. 1). The impediment of the gas flow due to the presence of the cantilever arm would affect the local pressure in the region of the lever arm, thereby affecting the plasma density and in turn affecting the azimuthal uniformity of the process results. Still another factor affecting azimuthal uniformity is the presence of wafer loading port 210, which exists on only one side of chamber 200.

FIG. 2B is a side view of the chamber to illustrate that certain inherent characteristics of the chamber design also introduce non-symmetry and therefore affect the azimuthal uniformity of the process results. For example, one side 252 of the lower electrode 204 may be provided with components such as gas feed, coolant tubes, and the like, which components change the inductance that is presented to any current traveling along the surface of lower electrode 204. Some of these components may not be present on another side 254 of the lower electrode 204. As such, one side of the wafer, which rests on lower electrode 204, may experience a different process result relative to the other side of that wafer, again introducing azimuthal non-uniformity. Further, the fact that the RF feed and/or exhaust current path is a sideway feed in the direction of arrow 220 means that the RF return current has variable-length azimuthal path to return to the power supply depending on whether the RF ground return current is measured on the inside path 222 or the outside path 224

The differences in the lengths of the RF ground return paths introduce different inductances along the ground return paths, which also affect the impedances of the ground return paths. These variations thus create non-symmetry and azimuthal non-uniformity of the process results.

When the process requirements are fairly liberal (for example, when the device sizes are large and/or device density is low) azimuthal non-uniformity is a lesser concern. As device sizes become smaller and device density increases, it, is important to maintain uniformity not only in the radial direction (from the center to the edge of the wafer but also in the azimuthal direction at any given angle theta from a reference radius R on the wafer surface. For example, some customers nowadays require that azimuthal non-uniformity be at 1% or even below the 1% threshold. Accordingly, there are desired improved methods and apparatus for managing azimuthal non-uniformity of process results in a plasma processing chamber.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4A shows, in accordance with an embodiment, an arrangement for tuning the RF delivery currents in the azimuthal direction.

DETAILED DESCRIPTION OF EMBODIMENTS

Figure 1:
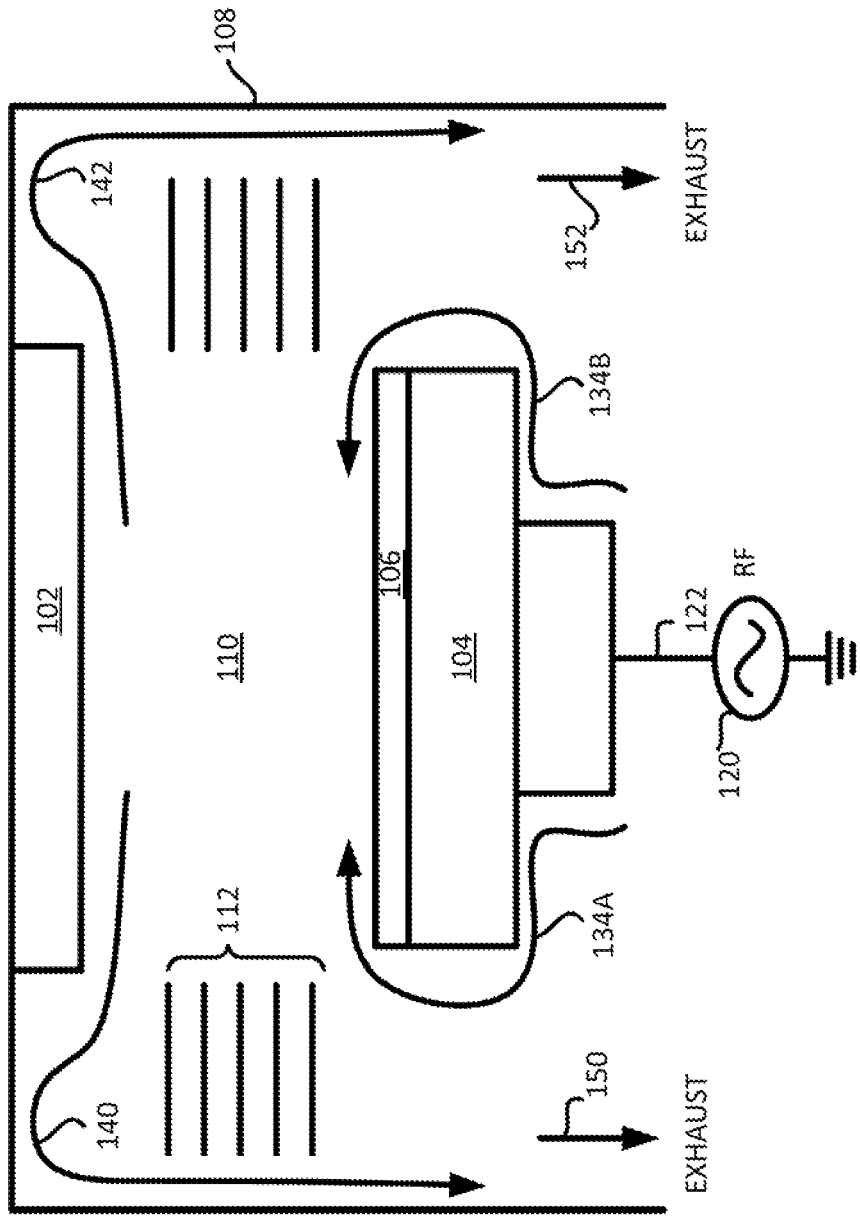
FIG. 1 shows, in accordance with an embodiment of the invention, a typical capacitively coupled plasma processing system having an upper electrode, a lower electrode on which a wafer may be disposed for processing.

The present invention will now be described in detail with reference to a few embodiments thereof as illustrated, in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various In accordance with embodiments of the invention, there are provided methods and apparatuses for compensating for the inherent or foreseeable non-symmetry and/or azimuthal non-uniformity in a plasma processing chamber. In one or more embodiments, the impedances of the ground straps that are employed to couple the sidewall or liner of the chamber with the grounded plane are provided with tunable impedances in order to permit an operator or a design engineer to vary the azimuthal impedances in the ground straps to compensate for the inherent or foreseeable non-symmetry due to the presence or use of other components of the chamber.

In one or more, embodiments, there are provided methods and apparatus for controlling the impedances of the ground straps affect the impedances that are seen by the RF ground return currents in the azimuthal direction, thereby permitting the operator to tune the impedances and the RF ground return currents azimuthally around the wafer periphery. This compensates for any inherent or foreseeable non-symmetry and/or azimuthal non-uniformity of the process results.

In one or more embodiments, the RF delivery paths may be tuned azimuthally so that one side or one portion of the chamber may experience a different impedance presented to the RF delivery current than another portion of the chamber. The impedances that are presented to the RF delivery current may be tuned by providing metal or conductive plugs. The plugs may be disposed in the insulator ring that surrounds and underlies the lower electrode for example. By selectively connecting and disconnecting the plugs that are azimuthally arranged in the insulator ring, the lengths of the paths traversed by the RF ground return currents are varied in order to compensate for any inherent or foreseeable non-symmetry and azimuthal non-uniformity.

In one or more embodiments, a metallic ring may be disposed under the substrate in order to allow the operator to vary the center of the ring relative to the center of the lower electrode in order to counteract the inherent or foreseeable non-uniformity due to the presence of chamber components and other processing realities.

In one or more embodiments, the ground shield may be modified such that one side presents a shorter path for the ground RF return current than the other side. Alternatively or additionally, the center of the ground shield may be shifted such that the coupling from the ground shield to the charged conductor that is used to carry the RF signal(s) to the lower electrode is intentionally made non-symmetric to compensate for any inherent or foreseeable non-uniformity and/or azimuthal non-uniformity and/or non-symmetry.

The features and advantages of the invention may be better understood with reference to the figures and discussions that follow.

Figure 3A:
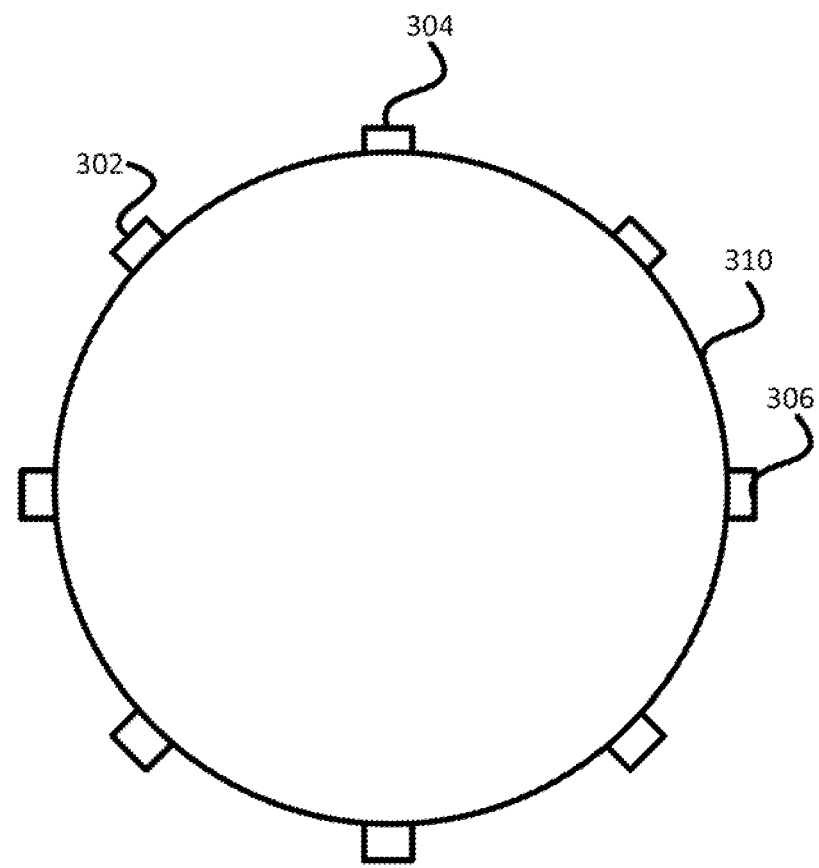
FIG. 3A shows, in accordance with an embodiment of the invention, a plurality of ground straps implemented with impedance devices.

FIG. 3A shows, in accordance with an embodiment of the invention, a simplified top down view of the ground straps arranged around the periphery of the chamber, such as around the circumference of the chamber wall or chamber liner. The ground straps may be employed to provide RF ground return paths from the chamber liner or the chamber wall to the lower electrode for eventual return to ground, for example.

To elaborate, in a typical plasma processing chamber, there are provided ground straps disposed around the circumference of the chamber wall or the chamber liner in an attempt to evenly distribute the RF ground return currents in the azimuthal direction. In an embodiment, a tunable impedance in the form of a variable inductor, a variable capacitor, a variable resistor, or a combination thereof may be provided with one or more of the ground straps. Thus, with reference to FIG. 3A, ground straps 302 and 304 and 306 that are coupled to chamber wall 310 may be provided with tunable impedance devices (such as the aforementioned variable inductors, variable capacitors, variable resistors, or any combination thereof).

During development, the process engineer may assign values or adjust these tunable, impedance devices to provide compensation for the inherent or foreseeable non-symmetry or azimuthal non-uniformity. For example, a test wafer may be run and metrology results may be examined to assess the degree and location of azimuthal non-uniformity on the processed test wafer, for example. The tunable impedances of one or more of the ground straps may then be tuned in order to facilitate the presentation of different impedances to different RF ground return currents that traverse the various ground straps.

Figure 3B:
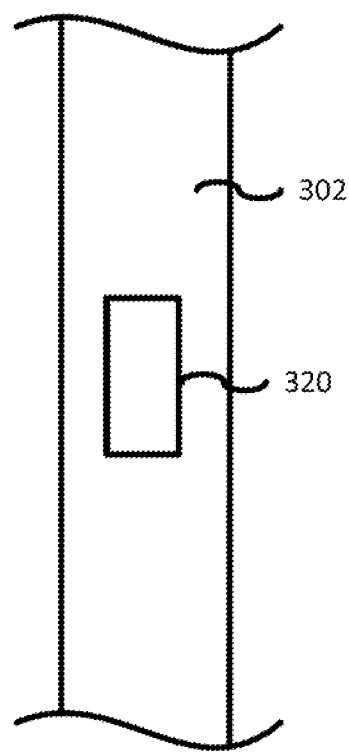
FIGS. 3B-3F show, in accordance with embodiments of the invention, various ways to modify the current in the ground strap to address azimuthal non-uniformity.

In an embodiment, each tunable impedance device may represent a fixed value impedance device (320 of FIG. 3B) that may be coupled with or associated with one or more individual ground straps in order to influence the azimuthal impedance or influence the impedance presented to various RF ground return currents as they traverse the ground straps. In this manner, the RF return currents may be tuned individually in the azimuthal direction to compensate or counter (either partly or wholly) the inherent non-symmetry due to the presence of chamber components or any observed or measured azimuthal non-uniformity (such as may be measured from a test wafer after processing, for example). In this case, at least one of the ground straps would be provided with, such an impedance device, and at least another one of the ground straps would not be provided with an impedance device having the same impedance value as the one provided with the at least one of the ground straps. This intentional asymmetry in providing impedances addresses the inherent or foreseeable azithmuthal non-uniformity around the chamber wall or chamber liner.

Figure 3C:
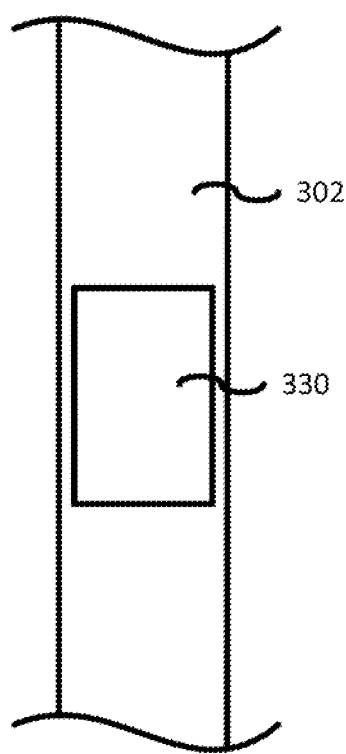

In another embodiment, the ground straps may be provided with tunable impedance devices (330 of FIG. 3C) that can be adjusted manually by a process engineer as part of the chamber qualification process either from modeled or known non-symmetry or azimuthal non-uniformity or from the observed azimuthal non-uniformity that is obtained through metrological results acquired from a test wafer.

For example, the process engineer may manually (or via a computer user interface) adjust the values of the tunable device(s) on one or more, of the ground straps in order to account for the non-symmetry that is caused by the cantilever arm used to support the lower electrode. As another example, the process engineer may manually (or via a computer user interface) adjust the values of the tunable impedance(s) for one or more of the ground straps when azimuthal non-uniformity is observed from metrological measurements of the process results on a test wafer.

In this case as well, at least one of the ground straps would be provided with such a tunable impedance device, and at least another one of the ground straps (e.g., the second ground strap for discussion purpose) would not be provided with a tunable impedance device having the same impedance value as the one provided with the at least one of the ground straps. As an example, no impedance device may be provided with the second ground strap or a tunable impedance device having a different impedance value would be provided with the second ground strap. This intentional asymmetry in providing impedances addresses the inherent or foreseeable azithmuthal non-uniformity around the chamber wall or chamber liner.

Figure 3D:
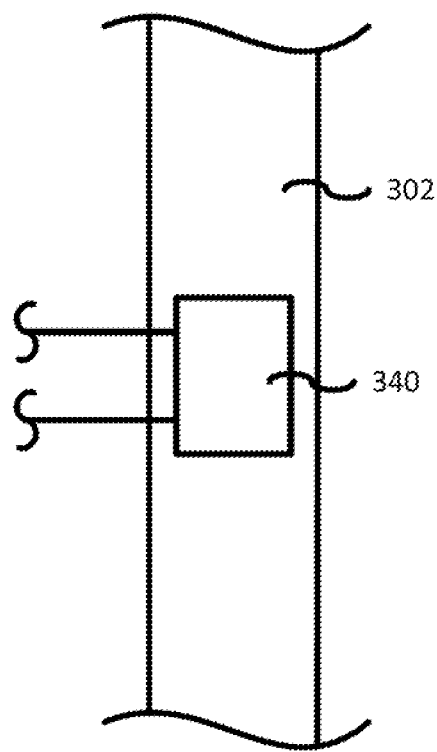

Still further, it is possible to employ sensors to measure the ground return currents on the individual ground straps and, in a dynamic manner, employ machine tunable impedance devices (340 of FIG. 3D) to dynamically tune the impedances to account for wafer-to-wafer variations in the azimuthal non-uniformity or non-symmetry, for example.

Figure 2A:
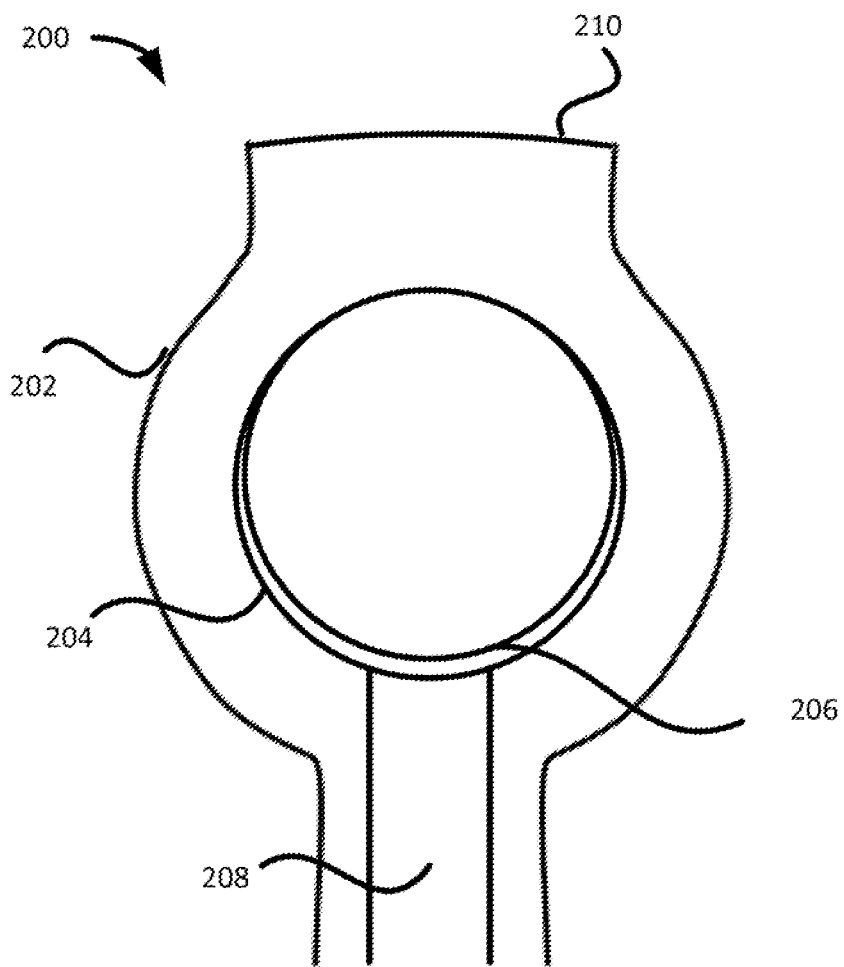
FIG. 2A shows, in accordance with an embodiment of the invention, various factors affecting the symmetry of components within the chamber and/or affecting the wafer symmetry relative to the chamber center, which may in turn affect the azimuthal uniformity of the process results on the wafer surface.
Figure 2B:
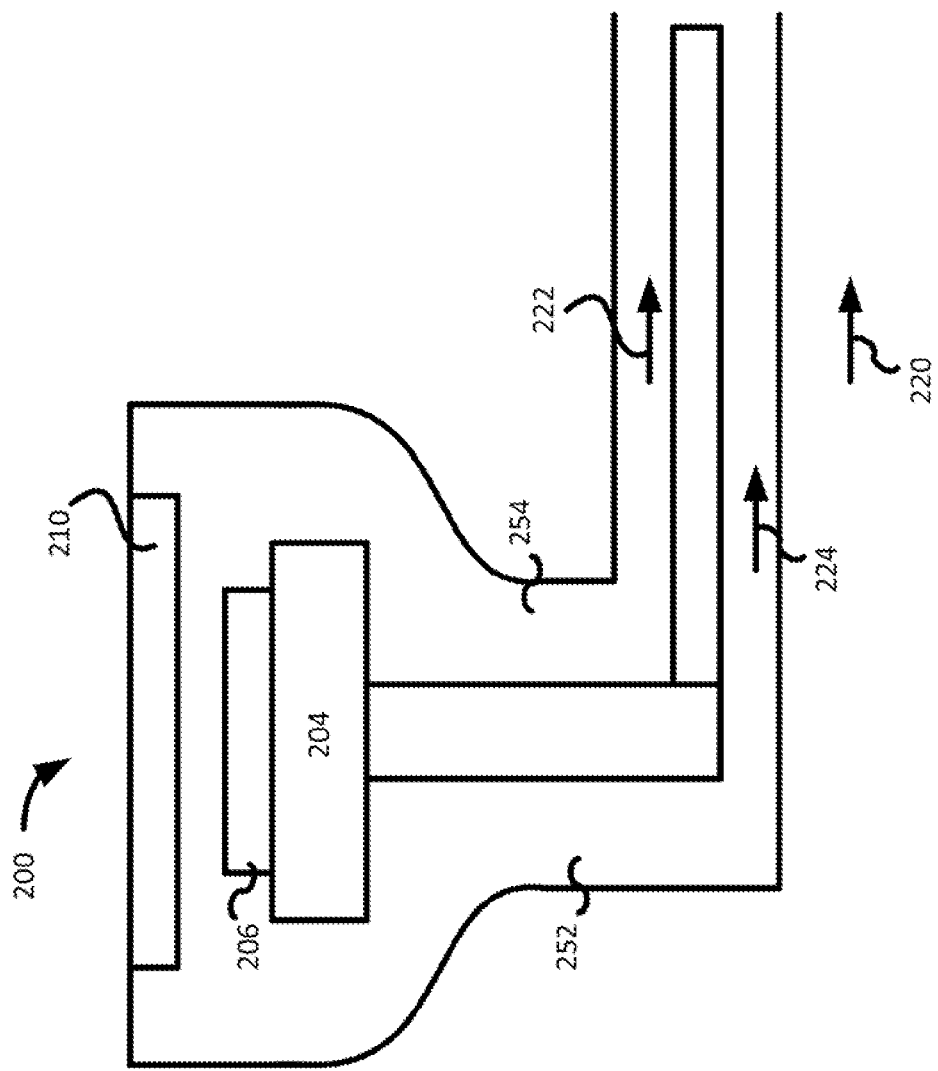
FIG. 2B shows, in accordance with an embodiment of the invention, a side view of the chamber to illustrate that certain inherent characteristics of the chamber design also introduce non-symmetry and therefore affect the azimuthal uniformity of the process results.

For example, if the wafer is positioned slightly of center relative to the lower electrode as in the example of FIG. 2A, measurements may be made in the RF ground return currents through the various straps and automated control equipment may tune the impedances associated with one or more of the ground straps in order to compensate for the fact that sensor measurements have detected non-symmetric conditions and/or the wafer is disposed off-center relative to the lower electrode in order to improve azimuthal uniformity of the process result. The machine tunable impedances may be provided with each of the ground straps or may be provided with only a subset of the ground, straps, for example. In one or more embodiments, the tuning of the machine tunable impedances may be performed in-situ on a wafer-by-wafer basis in response to sensor measurements or in response to computations made from sensor measurements. In one or more embodiments, the tuning of the impedances may be performed using the tool control computer or another computer executing computer readable instructions, including, computer readable instructions embodied in a computer readable medium such as a computer memory drive. In this case, at least one of the ground straps would be provided with such a machine tunable impedance device, and at least another one of the ground straps would not be provided with a machine tunable impedance device having the same impedance value as the one provided with the at least one of the ground straps. As an example, no impedance device may be provided with the second ground strap or a machine tunable impedance device would be adjusted to have a different impedance value would be associated with the second ground strap. This intentional asymmetry in providing impedances addresses the inherent or foreseeable azithmuthal non-uniformity around the chamber wall or chamber liner.

Figure 3E:
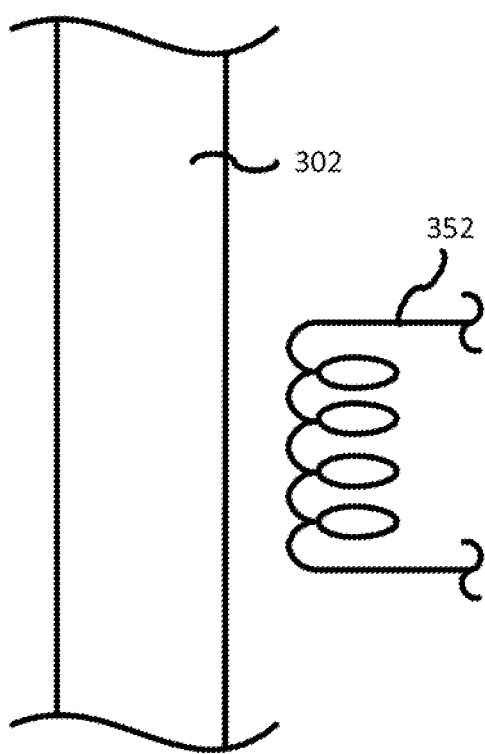
Figure 3F:
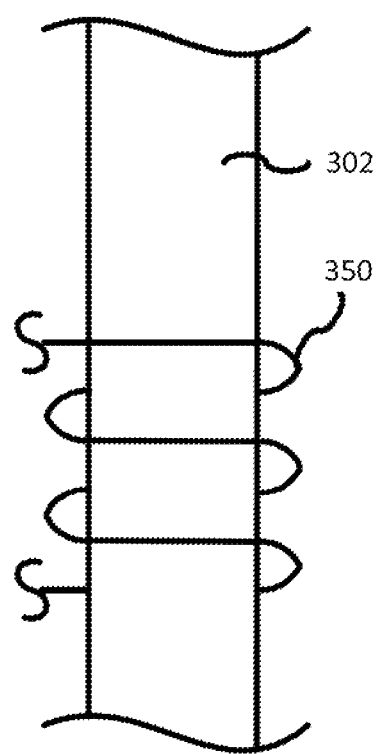

Still further, it is possible to induce a counter current in one or more of the ground straps in order to influence the RF ground return current in one or more of the ground straps. By way of example, a coil (350 of FIG. 3F or 352 of FIG. 3E) may be placed close to one or more of the ground straps or around one or more of the ground straps, and current may be flowed through the coil in order to induce a counter current on the ground strap itself or to induce an additive current in order to compensate for any inherent non-symmetry or azimuthal non-uniformity of the process results. A coil is considered associated with a ground strap if it is placed closer to that ground strap than any other ground strap of the plurality of ground straps.

The coil current(s) may be varied in phase, in intensity, and/or in frequency in order to change the degree by which the RF return current is influenced in one or more of the ground straps. This current-oriented compensation may be performed dynamically in-situ to achieve in-situ adjustments of the RF return ground currents in the azimuthal direction. For example, in one or more embodiments, the in-situ adjustment may dynamically, in a real time manner, compensate for the azimuthal non-uniformity and/or for the non-symmetry of the chamber components in a plasma processing chamber.

As another example, the RF ground return currents and/or the compensating coil currents may be ascertained for one or more of the ground straps during chamber qualification. During production, these coil current values may be entered as part of the recipe in order to ensure that any non-symmetry or non-uniform or azimuthal non-uniformity of process results would be compensated for either partly or wholly.

In one or more embodiments, the tuning of the coil currents may be performed in-situ on a wafer-by-wafer basis in response to sensor measurements or in response to computations made from sensor measurements. In one or more embodiments, the tuning of the coil currents may be performed using the tool control computer or another computer executing computer readable instructions, including computer readable instructions embodied in a computer readable medium such as a computer memory drive. In this case, at least one of the ground straps would be provided with such a coil, and at least another one of the ground straps would not be provided with a coil having the same impedance value, as the one provided with, the at least one of the ground straps. As an example, no coil may be provided with the second ground strap or a coil would be adjusted to have a different coil current would be associated with the second ground strap. This intentional asymmetry in providing impedances addresses the inherent or foreseeable azithmuthal non-uniformity around the chamber wall or chamber liner.

Figure 3G:
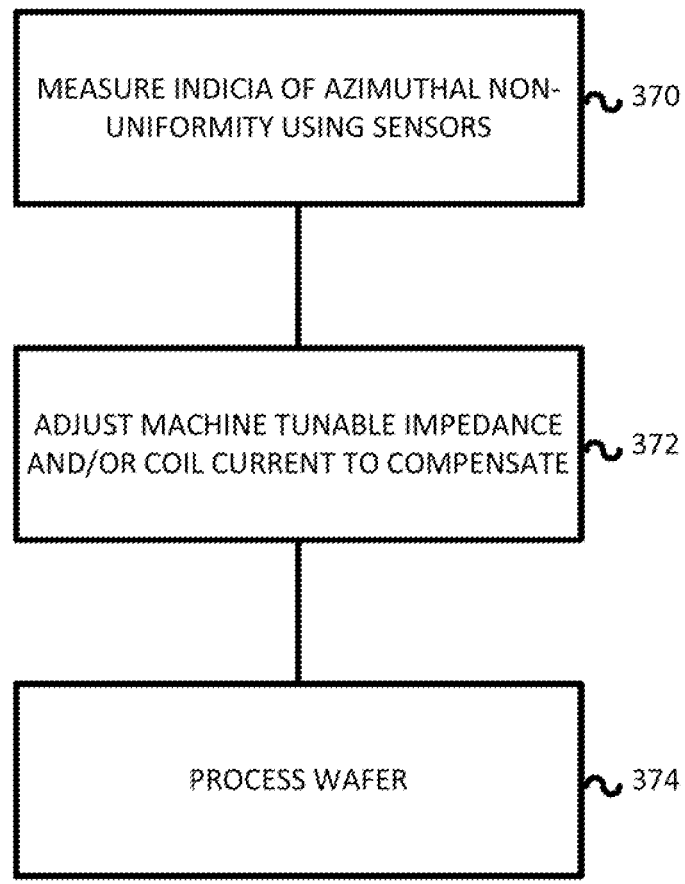
FIG. 3G shows, in one or more embodiments, the steps for in-situ compensation to address the azimuthal non-uniformity issue.

FIG. 3G shows, in one or more embodiments, the steps for in-situ compensation to address the aforementioned azimuthal non-uniformity issue. In step 370, indicia of azimuthal non-uniformity are measured using sensors. The sensors maybe a set of PIF (plasma ion flux) probes, optical sensors, V/I probe, optical emission sensors, etc. The sensors may be disposed in one or more locations around the chamber. The indicia may be any measurable parameter that may be employed to ascertain azimuthal non-uniformity, including voltage, current, plasma flux, optical emission, virtual metrology computations, etc. In step 372, the machine tunable impedances and/or the coil currents are adjusted in-situ in response to sensor measurements or in response to computations made from sensor measurements. In step 374, the wafer is processed. The steps of FIG. 3G may be performed wafer-by-wafer or may be performed for a test wafer for every N wafers processed, for example or may be performed periodically on a schedule or may be performed during chamber maintenance or recalibration.

FIG. 4A shows, in accordance with an embodiment, an arrangement for tuning the RF delivery currents in the azimuthal direction. In the embodiment of FIG. 4A, there are provided a plurality of conductive plugs that can be selectively connected to the lower electrode in order to locally modify the lengths of the current paths and/or the impedances presented to the RF delivery current paths in order to compensate for (partly or wholly) the non-symmetry and/or azimuthal non-uniformity of process results around the periphery of the wafer.

With reference to FIG. 4A, a simplified portion of a plasma processing system 402 is shown. In FIG. 4A, there is a shown a lower electrode 404 upon which a wafer (not shown) is disposed for processing. The lower electrode may implement, for example, an electrostatic chuck and may include, as is well known, a conductive portion. In the example of FIG. 4A, surrounding and under lower electrode 404 is an insulative portion which is implemented by an insulating ring 406. Insulating ring 406 may be a single part or a composite part that is used to provide RF and bias isolation of lower electrode from the other components of the plasma processing chamber. Generally speaking, the insulative portion may be disposed at any location between the RF supply source and the conductive portion.

Within cavities in insulator ring 406, there are disposed RF path modifiers 450 that can be selectively connected and disconnected to the conductive portion of the lower electrode to modify the lengths of the RF delivery current paths. The RF path modifiers may be disposed partly or wholly within insulator ring 406. The RF path modifiers are disposed at different angular positions relative to a reference angle drawn from the center of said insulative component. For example, if the insulative component is circular or ring-like, the RF path modifiers would be disposed along different radii drawn from the center of the insulative component relative to a reference radius drawn from the same center. In one or more embodiments, the angular intervals between adjacent RF path modifiers are the same so that the RF path modifiers are evenly distributed relative to the reference angle. In other embodiments, the angular intervals between adjacent RF path modifiers may be different.

Figure 4B:
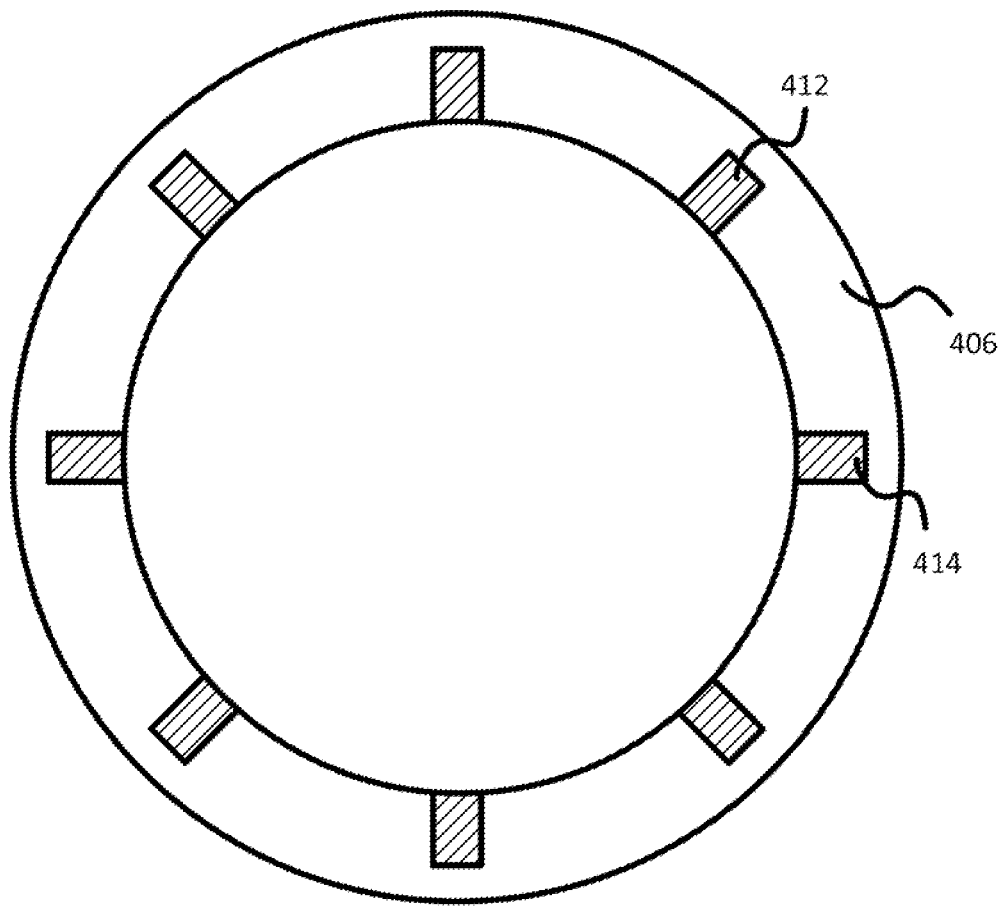
FIG. 4B is a cutaway top view, in accordance with an embodiment, of an insulator ring with conductive plugs disposed around insulator ring.
Figure 4C:
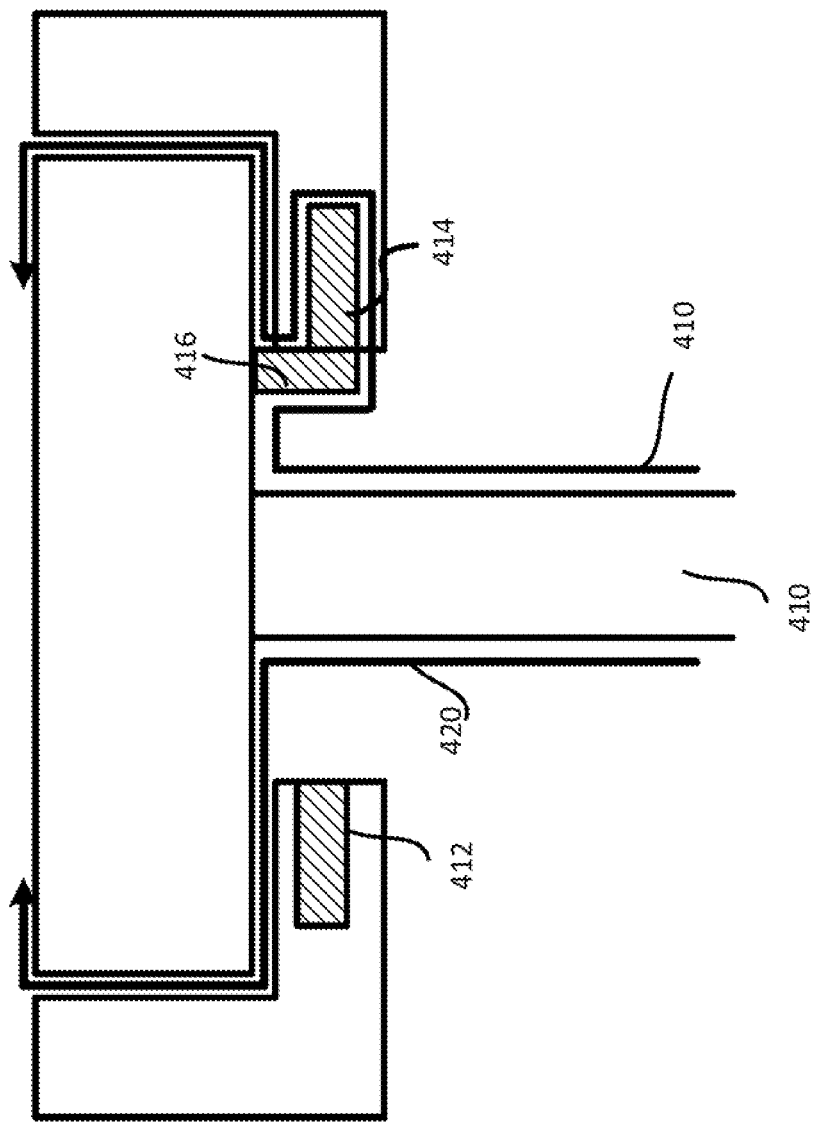
FIG. 4C shows, in accordance with an embodiment, another view of an arrangement for tuning the RF delivery currents in the azimuthal direction.

In the example of FIGS. 4A and 4C, the RF path modifiers are conductive plugs that are conductive to the RF delivery currents delivered via RF conductor 410 to lower electrode 404. In the cutaway view of FIG. 4C, two cutaway portions of conductive plugs 412 and 414 are shown. In this example, plug 412 is not electrically connected to lower electrode 404 while plug 414 is electrically connected to lower electrode 404 via connection 416. The RF delivery current on the left side of FIG. 4C flows along the direction of arrow 420, which bypasses conductive plug 412 since the RF current traverses along the surface of RF conductor 410, the lower surface of lower electrode 404, the side of lower electrode 404, and toward the top surface of lower electrode 404 for coupling with the plasma in the plasma generating region.

Plug 414 is electrically connected to lower electrode 404 as discussed earlier. Accordingly, the RF delivery current follows the direction of path of arrow 430 on the right side of FIG. 4A. With reference to FIG. 4C, both arrows 420 and 430 are reproduced in greater magnification to show that the lengths of the paths through which the RF delivery currents traverse vary depending on whether the conductive plugs are electrically connected or disconnected from the lower electrode.

FIG. 4B is a cutaway top view of insulator ring 406, which shows that the conductive plugs are disposed around insulator ring 406 so as to facilitate the tuning of the impedances presented to the RF delivery currents in the azimuthal direction. In practice, one or more of the conductive plugs may be selectively connected electrically with the lower electrode or selectively disconnected electrically with respect to the lower electrode. The connection may be automated via remotely controlled switches, which may be controlled by a microprocessor for example. The number, size, and location of the conductive plugs around the insulator ring may vary as desired.

In one or more embodiments, the RF path modifiers may be implemented instead using fixed impedance devices instead of conductive plugs. In this embodiment of FIGS. 4A-4C, the term "impedance device" implies the use of at least one of a capacitor and an inductor. In this manner, greater correction of the azimuthal non-uniformity may be achieved since the impedance devices, implemented using inductors, resistors, capacitors, and/or networks thereof, may be tuned to control the modification of the RF current paths to a greater extent.

In one or more embodiments, the RF path modifiers may be implemented instead using machine tunable impedance devices so that the tuning of the azimuthal RF delivery currents is controlled not only by the selective connecting and disconnecting (electrically speaking) of the conductive plug but also by the tuning of each machine tunable impedance device that is connected to the lower electrode. In this embodiment of FIGS. 4A-4C, the term "machine tunable impedance device" implies the use of at least one of a capacitor and an inductor and the impedance parameter may be adjustable by issuing electrical control signals. Electrical leads connecting to the machine tunable impedance devices render the devices tunable remotely, via a computer interface by an operator, or by executing computer readable instructions.

In one or more embodiments, the tuning of the RF currents may be performed in-situ. This tuning ability provides an additional control knob to address non-uniformity issues. For example, the connecting/disconnecting of the conductive plugs may be individually controlled by using switches that can be remotely activated. The closings of the switches may be performed responsive, to an operator command via an appropriate UI on a computer, or may be performed automatically in response to sensor measurements that indicate manipulation of RF return currents may be needed to address azimuthal non-uniformity issues.

If the plugs are implemented using machine tunable impedance devices (e.g., inductors and/or capacitors and/or resistors and/or circuits comprising same), individual tunable impedance devices may also have their parameters tuned via an appropriate UI on a computer or may be performed automatically in response to sensor measurements that indicate manipulation of RF return currents may be needed to address azithmuthal non-uniformity issues.

In one or more embodiments, the RF path modifiers may be embedded, either partly or wholly, within another component other than the insulative ring that is disposed under the electrode. As long as the presence of one or more RF path modifiers can change the lengths of the RF current delivery paths to address azimuthal non-uniformity, the RF path modifiers may be embedded, partly or wholly, within any suitable chamber component part or any additional part to be added to the chamber.

In one or more embodiments, the ground straps (with or without tunable impedances and/or coils) of FIGS. 3A-3G may be combined with the electrically connectable plugs of FIGS. 4A-4C in order to provide more control knobs to address the non-uniformity issues.

In one or more embodiments, the ground straps of FIGS. 3A-3G (with or without tunable impedances and/or coils) may be combined with the electrically connectable impedance devices (which implement the plugs of FIG. 4A-4C) in order to provide more control knobs to address the non-uniformity issues. The combination of these two techniques provides a level of control, whether automatically in-situ or manually as chamber adjustment is performed, over non-uniformity in a manner previously unavailable in the prior art.

Figure 5:
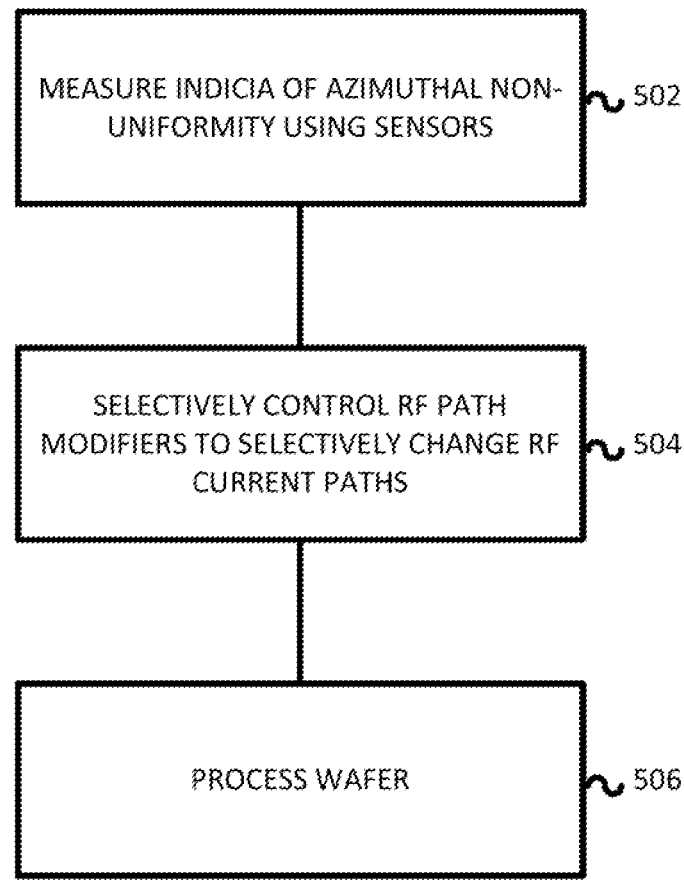
FIG. 5 shows, in one or more embodiment, the steps for in-situ compensation to address the azimuthal non-uniformity issue.

FIG. 5 shows, in one or more embodiment, the steps for in-situ compensation to address the aforementioned azimuthal non-uniformity issue. In step 502, indicia of azimuthal non-uniformity are measured using sensors. The sensors maybe a set of PIF (plasma ion flux) probes, optical sensors, V/I probe, optical emission sensors, etc. The sensors may be disposed in one or more locations around the chamber or on one or more chamber components such as the electrode.

The indicia may be any measurable parameter that may be employed to ascertain azimuthal non-uniformity, including voltage, current, plasma flux, optical emission, virtual metrology computations, etc.

In step 504, the RF path modifiers may be selectively controlled to change the RF current paths in order to address the azithmuthal non-uniformity. Various ways to control the RF path modifiers to change the RF current paths have been discussed above. The selective control of the RF path modifiers may be performed in-situ in response to sensor measurements or in response to computations made from sensor measurements. In step 506, the wafer is processed. The steps of FIG. 5 may be performed wafer-by-wafer or may be performed for a test wafer for every N wafers processed, for example or may be performed periodically on a schedule or may be performed during chamber maintenance or recalibration.

As can be appreciated from the foregoing, embodiments of the invention provide additional control knobs for the process engineer to compensate for non-symmetry of chamber components in a plasma processing chamber and for azimuthal non-uniformity of process results. The compensation devices and techniques are practiced outside of the plasma generating region (such as plasma generating, region 110 of FIG. 1), thereby substantially eliminating the introduction of unpredictable or difficult to control side effects to the plasma process. The fact that the tunable impedance devices are disposed away from the plasma processing environment (i.e., in a region where plasma is not present during processing) also improves the lifetime of the tunable impedance devices, reduced the potential contribution of contaminants into the plasma processing environment, and the like.

While this invention has been described in terms of several preferred embodiments, there are alterations, permutations, and equivalents, which fall within the scope of this invention. For example, although the chamber employed in the example is a capacitive chamber, embodiments of the invention work equally well with inductively coupled chambers or chambers using another type of plasma processing technology, such as Electron Cyclotron Resonance, Microwave, etc. Although various examples are provided herein, it is intended that these examples be illustrative and not limiting with respect to the invention. Also, the title and summary are provided herein for convenience and should not be used to construe the scope of the claims herein. Further, the abstract is written in a highly abbreviated form and is provided herein for convenience and thus should not be employed to construe or limit the overall invention, which is expressed in the claims. If the term "set" is employed herein, such term is intended to have its commonly understood mathematical meaning to cover zero, one, or more than one member. It should also be noted that there are many alternative ways of implementing the methods and apparatuses of the present invention. It is therefore intended that the following appended claims be interpreted as including all such alterations, permutations, and equivalents as fall within the true spirit and scope of the present invention.

What is claimed is:
1. A plasma processing system having a plasma processing chamber, comprising:
   an RF power supply;
   a lower electrode having a conductive portion;
   an insulative component disposed in an RF current path between said RF power supply and said conductive portion; and
   a plurality of RF path modifiers disposed within said insulative component, said plurality of RF path modifiers being disposed at different angular positions relative to a reference angle drawn from a center of said insulative component, wherein each of the plurality of RF path modifiers is defined by a same structure so that the plurality of RF path modifiers are arranged symmetrically in a circular arrangement under the conductive portion;

whereby at least a first one of said plurality of RF path modifiers is electrically connected to said conductive portion and at least a second one of said plurality of said plurality of RF path modifiers is not electrically connected to said conductive portion, and each of the plurality of RF path modifiers being individually adjustable to define an intentional non-symmetric impedance at different regions around the circular arrangement to compensate for sensed azimuthal non-uniformities in the plasma processing system.

2. The plasma processing system of claim 1 wherein said plurality of RF path modifiers are evenly disposed at regular angular intervals relative to said reference angle.

3. The plasma processing system of claim 1 wherein said plurality of RF path modifiers are implemented using conductive plugs.

4. The plasma processing system of claim 1 wherein said plurality of RF path modifiers are implemented using impedance devices, each of said impedance devices includes at least one of a capacitor and an inductor.

5. The plasma processing system of claim 1 wherein each of said plurality of RF path modifiers is individually selectively connectable to said conductive portion, whereby connecting of each of said plurality of RF path modifiers is performed via electrical control signaling transmitted to said each of said plurality of RF path modifiers.

6. The plasma processing system of claim 5 wherein said connecting of each of said plurality of said plurality of said plurality of RF path modifiers is performed automatically in-situ in response to sensor measurements.

7. The plasma processing system of claim 5 wherein said connecting of each of said plurality of said plurality of said plurality of RF path modifiers is performed automatically in-situ responsive to computer readable instructions from a computer.

8. The plasma processing system of claim 1 wherein said lower electrode is an electrostatic chuck.

9. The plasma processing system of claim 1 wherein said plurality of RF path modifiers are implemented using machine tunable impedance devices, each of said impedance devices includes at least one of a capacitor and an inductor, wherein impedance value of each of said plurality of RF path modifiers is adjustable via at least one electrical control signal.

10. The plasma processing system of claim 9 wherein said at least one electrical control signal is generated using a computer executing computer readable instructions embodied in a non-transitory computer readable medium.

11. The plasma processing system of claim 9 wherein impedance values of said plurality of RF modifiers are adjusted by machine tunable impedance devices in-situ on a wafer-by-wafer basis in response to sensor measurements.

12. The plasma processing system of claim 9 wherein impedance values of said plurality of RF modifiers are automatically tuned by machine tunable impedance devices in-situ at least on a wafer-by-wafer basis during production in response to sensor measurements that indicate manipulation of RF return currents may be needed to address azimuthal non-uniformity issues.

13. The plasma processing system of claim 1 further comprising:
at least one of a chamber wall and a chamber liner;
a plurality of ground straps disposed around a circumference of a chamber surface, said chamber surface being one of said chamber wall and said chamber liner of said plasma processing chamber;
at least a first impedance device coupled to at least a first ground strap of said plurality of ground straps, wherein a second ground strap of said plurality of ground straps is not provided with a second impedance device having the same impedance value as said first impedance device.

14. The plasma processing system of claim 1 further comprising:
at least one of a chamber wall and a chamber liner;
a plurality of ground straps disposed around a circumference of chamber surface, said chamber surface being one of said chamber wall and said chamber liner of said plasma processing chamber; and
at least a first coil magnetically coupled to at least a first ground strap of said plurality of ground straps, wherein a second ground strap of said plurality of ground straps is not provided with a second coil having the same coil current value as said first coil.

15. A plasma processing system having a plasma processing chamber, comprising:
an RF power supply;
a lower electrode having a conductive portion;
an insulative component disposed in an RF current path between said RF power supply and said conductive portion; and
a plurality of RF path modifiers disposed between said RF power supply and said conductive portion, each of said plurality of RF path modifiers being disposed at different angular positions relative to a reference angle drawn from a center of said insulative component;
wherein each of the plurality of RF path modifiers is defined by a same structure so that the plurality of RF path modifiers are arranged symmetrically in a circular arrangement under the conductive portion;
whereby at least a first one of said plurality of RF path modifiers is electrically connected to said conductive portion and at least a second one of said plurality of said plurality of RF path modifiers is not electrically connected to said conductive portion, wherein said plurality of RF path modifiers are implemented using impedance devices, each of said impedance devices being individually adjustable to define an intentional non-symmetric impedance at different regions around the circular arrangement to compensate for sensed azimuthal non-uniformities in the plasma processing system.

16. The plasma processing system of claim 15 wherein said plurality of RF path modifiers are evenly disposed at regular angular intervals relative to said reference angle.

17. The plasma processing system of claim 15 wherein said lower electrode is an electrostatic chuck.

18. The plasma processing system of claim 15 wherein said plurality impedance devices are implemented using machine tunable impedance devices, each of said impedance devices includes at least one of a capacitor and an inductor, wherein impedance value of each of said plurality of RF path modifiers is adjustable via at least one electrical control signal to compensate for the non-uniformities that cause non-symmetry in process results.

19. The plasma processing system of claim 15 wherein impedance values of each of said impedance devices of said plurality of RF modifiers are adjusted by machine tunable impedance devices in-situ on a wafer-by-wafer basis in response to sensor measurements that sense the azimuthal non-uniformities in the plasma processing system.

20. The plasma processing system of claim 15 wherein impedance values of each of said impedance devices of said plurality of RF modifiers are automatically tuned by machine tunable impedance devices in-situ at least on a wafer-by-wafer basis during production in response to sensor measurements that indicate manipulation of RF return currents may be needed to address the azimuthal non-uniformity.

* * * * *